United States Patent
Hönigschmid

(10) Patent No.: US 6,545,526 B2
(45) Date of Patent: Apr. 8, 2003

(54) FUSE CIRCUIT CONFIGURATION

(75) Inventor: Heinz Hönigschmid, East Fishkill, NY (US)

(73) Assignee: Infineon Technologies AG, Munich (DE)

( * ) Notice: Subject to any disclaimer, the term of this patent is extended or adjusted under 35 U.S.C. 154(b) by 108 days.

(21) Appl. No.: 09/867,257

(22) Filed: May 29, 2001

(65) Prior Publication Data

US 2001/0054948 A1 Dec. 27, 2001

(30) Foreign Application Priority Data

May 26, 2000 (DE) ........................... 100 26 253

(51) Int. Cl.[7] ............................................... H01H 37/76
(52) U.S. Cl. ................................................... 327/525
(58) Field of Search .................... 327/525; 365/225.7, 365/96

(56) References Cited

U.S. PATENT DOCUMENTS

| 4,860,256 | A |   | 8/1989  | Devin et al. ......... 365/189.03 |
|-----------|---|---|---------|----------------------------------|
| 5,319,592 | A | * | 6/1994  | Nguyen ..................... 365/96 |
| 5,345,110 | A | * | 9/1994  | Renfro et al. ............. 327/525 |
| 5,831,923 | A | * | 11/1998 | Casper ................... 365/225.7 |
| 6,236,599 | B1| * | 5/2001  | Goto ..................... 365/225.7 |

* cited by examiner

*Primary Examiner*—Toan Tran
(74) *Attorney, Agent, or Firm*—Laurence A. Greenberg; Werner H. Stemer; Ralph E. Locher

(57) ABSTRACT

A fuse circuit configuration is described wherein a compensation capacitor counteracts a parasitic capacitor. The parasitic capacitor occurs between a connection point of a switching transistor and a fuse and ground. The compensation capacitor is connected to an evaluation circuit. In this manner, the negative effects caused by the parasitic capacitor are compensated for.

4 Claims, 2 Drawing Sheets

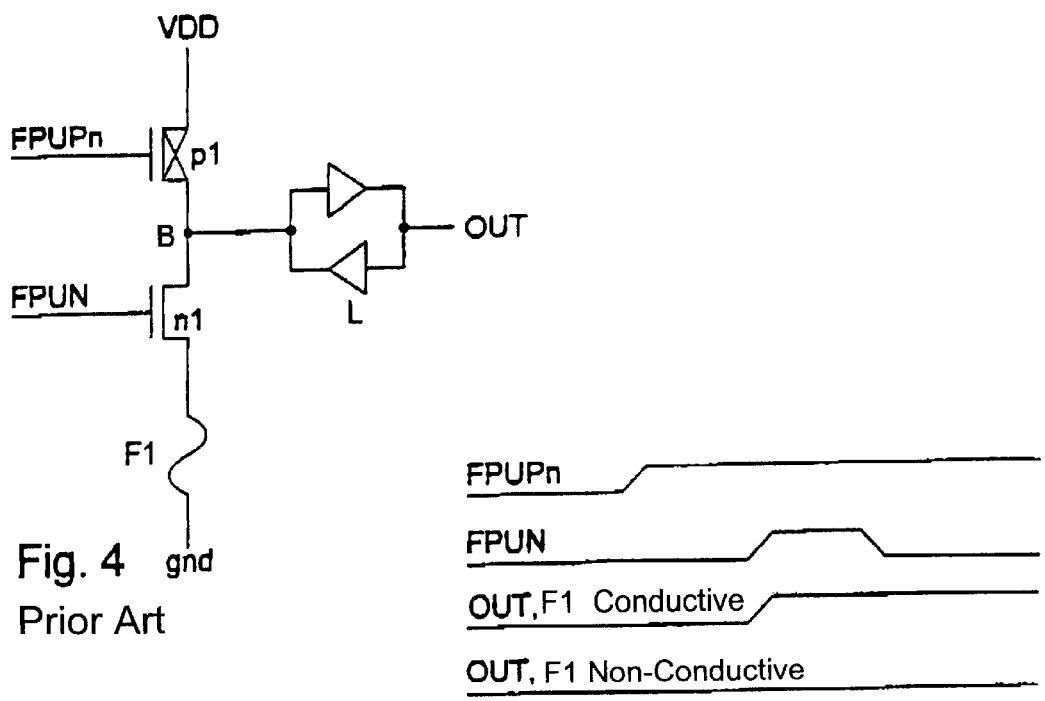
Fig. 4
Prior Art
Fig. 5
Prior Art
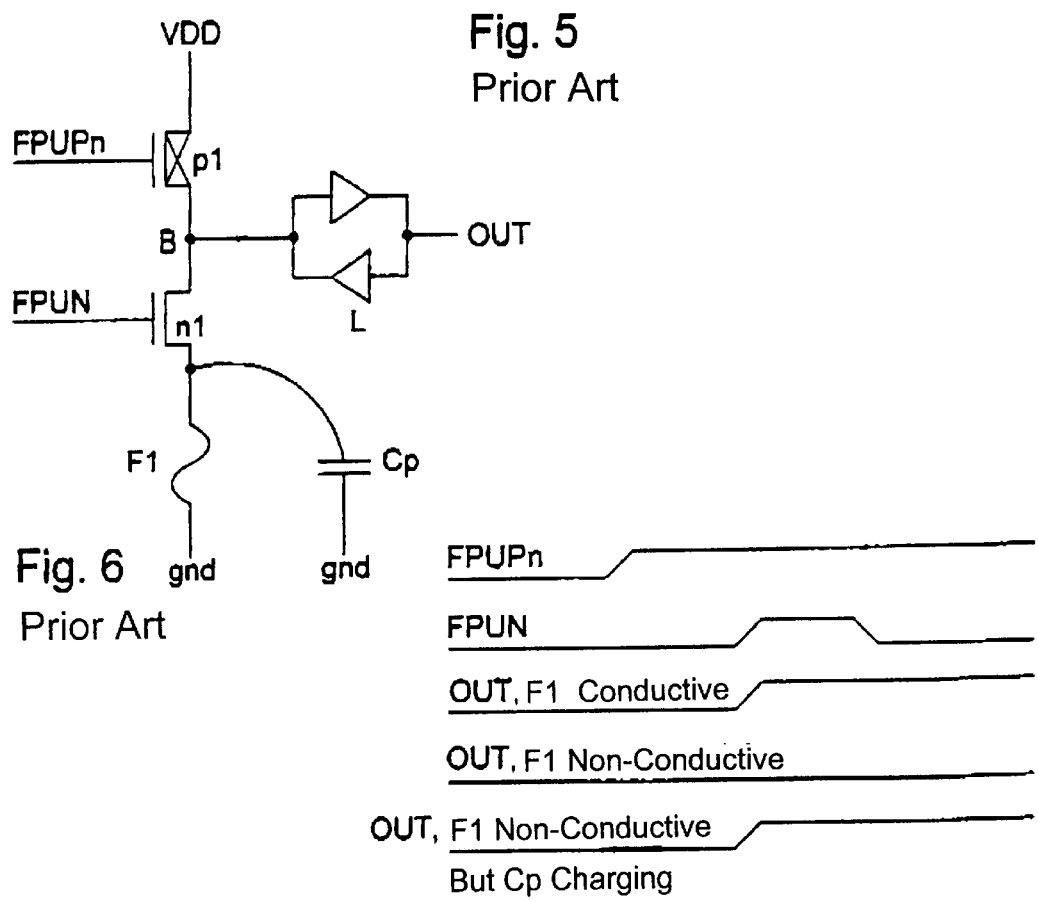
Fig. 6
Prior Art
Fig. 7

FUSE CIRCUIT CONFIGURATION

BACKGROUND OF THE INVENTION

FIELD OF THE INVENTION

The invention relates to a fuse circuit configuration formed of a series circuit composed of a first switching transistor, a second switching transistor, and a fuse. An evaluation circuit is connected at a junction between the two switching transistors, it being possible to store the state of the fuse at the output of the evaluation circuit. Fuse circuit configurations such as fuse latches are preferably utilized for redundancy, chip identification and various other settings in conventional memories such as DRAMs, FeRAMs, flashes and so on.

SUMMARY OF THE INVENTION

It is accordingly an object of the invention to provide a fuse circuit configuration that overcomes the above-mentioned disadvantages of the prior art devices of this general type, which practically excludes the possibility of misevaluations due to parasitic capacitors.

With the foregoing and other objects in view there is provided, in accordance with the invention, a fuse circuit configuration. The fuse circuit configuration contains a first switching transistor and a second switching transistor disposed in series with the first switching transistor and defines a series circuit with a junction point disposed between the first switching transistor and the second switching transistor. A fuse is connected to the second switching transistor. An evaluation circuit is connected to the junction point and has an output at which a status of the fuse can be tapped. A compensation capacitor is connected to the junction point and counteracts a parasitic capacitor occurring between a connection point between the second switching transistor and the fuse on a first side and ground on a second side.

The object is inventively achieved in a fuse configuration of the above mentioned type by a compensation capacitor which is connected to the junction and which counteracts a parasitic capacitor arising between the connection between the second switching transistor and the fuse, on one side, and ground, on the other side. The compensation capacitor can simulate the layout of the connection between the second switching transistor and the fuse.

In the inventive fuse circuit configuration, a compensation capacitor is provided at the junction between the two switching transistors. The compensation capacitor is initially charged to a high potential. The required charging current for the parasitic capacitor can thereby be drawn from the compensation capacitor without having to fear a tipping of the latch. For reasons of space, the compensation capacitor should not be proportioned too large.

Rather, the compensation capacitor should have the same value (i.e. capacitance) as the parasitic capacitor. This can be accomplished by also simulating the layout of the connection between the second switching transistor and the fuse in the connection between the junction and the latch. In other words, the layout of the fuse configuration is repeated in the evaluation circuit to the greatest extent possible in order to generate the compensation capacitor that counteracts the parasitic capacitor.

With the foregoing and other objects in view there is provided, in accordance with the invention, a fuse circuit configuration. The fuse circuit configuration contains a a first switching transistor and a second switching transistor disposed in series with the first switching transistor and defines a series circuit with a junction point disposed between the first switching transistor and the second switching transistor. A fuse is connected to the second switching transistor. An evaluation circuit is connected to the junction point and has an output at which a status of the fuse can be tapped. A ground terminal is provided and a compensation capacitor is connected between the junction point and the ground terminal. The compensation capacitor delivers a charging current for a parasitic capacitor occurring between a connection between the second switching transistor and the fuse on a first side and the ground terminal on a second side.

Other features which are considered as characteristic for the invention are set forth in the appended claims.

Although the invention is illustrated and described herein as embodied in a fuse circuit configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 4 is a circuit diagram of an existing fuse circuit configuration;

FIG. 5 is a graph showing signals in the fuse circuit configuration shown in FIG. 4;

FIG. 6 is a circuit diagram corresponding to FIG. 4, with an additional parasitic capacitor; and FIG. 7 is a graph showing signals in the fuse circuit configuration of FIG. 6, with the additional parasitic capacitor.

DESCRIPTION OF THE PREFERRED EMBODIMENTS

Figure 1:
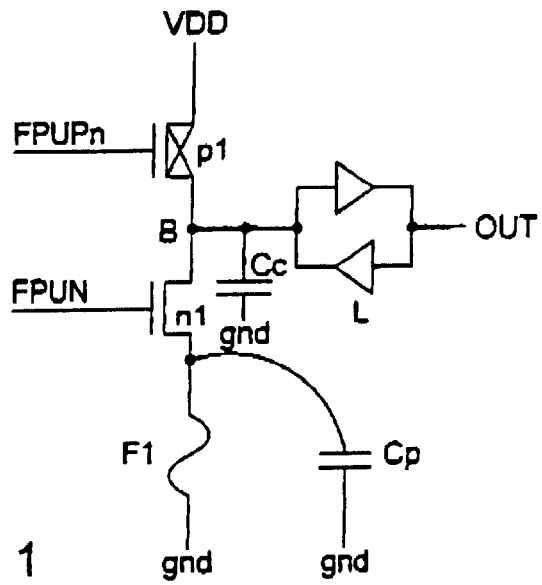
FIG. 1 is a circuit diagram of a fuse circuit configuration according to the invention.

In all the figures of the drawing, sub-features and integral parts that correspond to one another bear the same reference symbol in each case. Referring now to the figures of the drawing in detail and first, particularly, to FIG. 4 thereof, there is shown a representation of a known fuse latch. Between a chip supply voltage VDD and ground gnd there is a series circuit composed of a p-channel MOS field effect transistor p1, an n-channel MOS field effect transistor n1, and a fuse F1. The transistor p1 is controlled by a signal FPUPn, whereas the transistor n1 is controlled by a signal FPUN. A junction B between the two transistors p1 and n1 is connected to a latch L, which has an output OUT.

During the initializing of the fuse latch, the control signal FPUPn is initially held at a low level, i.e. active, thereby switching through the transistor p1 and putting it in a conductive state. The junction B is thereby charged to the voltage VDD and held at this potential by the latch L. The potential gnd, which is the inverse thereof, is available at the output OUT.

The control signal FPUPn is then deactivated, i.e. drawn to the potential VDD, and the signal FPUN is activated, i.e., raised to a high level. The transistor 1 is thereby switched through transiently. The potential at junction B is dependent upon whether the fuse F1 is continuous, i.e. conductive, or blown, i.e. non-conductive. It is noted that an anti-fuse can also be used instead of the fuse F1. An anti-fuse is non-conductive, and it is conductive in the blown state.

If the fuse F1 is conductive, the junction B is drawn to the potential gnd, whereas the potential VDD is maintained when the fuse is non-conductive.

The latch L stores this setting at its output OUT inverted. If the fuse F1 is non-conductive, i.e. the junction B is at potential VDD, then the output OUT is at low potential gnd, whereas, when the fuse F1 is conductive, the junction B is at potential gnd and the inverted potential VDD is available at the output OUT.

FIG. 5 shows the characteristic of the signals FPUPn and FPUN as well as the potential profile at the output OUT given a conductive fuse f1 and given a non-conductive fuse F1. An evaluation of the fuse information (conductive or non-conductive, i.e. not blown or blown for the fuse and blown and not blown for the anti-fuse, respectively) is obtained at the output OUT.

In the existing fuse circuit configuration as represented in FIG. 4, parasitic capacitors can cause a misevaluation of the fuse information, which will be described more closely with reference to FIGS. 6 and 7.

A parasitic capacitor Cp, which emerges automatically via surfaces or lines in the layout of the circuit configuration, is connected in parallel to the fuse F1. The parasitic capacitor Cp then effectuates a discharging of the junction B even when the fuse F1 is non-conductive. Specifically, the parasitic capacitor Cp is charged by way of the conductive transistor n1 given a non-conductive fuse F1, thereby discharging the junction B. When the junction B has been discharged, the high potential VDD stands at output OUT. That is, the latch L tilts, which leads to a faulty evaluation of the status of the fuse F1. This is recognizable in FIG. 7. At the output OUT the same evaluation is obtained when the fuse F1 is conductive and when it is non-conductive. A misevaluation such as this makes the fuse circuit configuration unusable and unsuitable for use in memory configurations, for example.

As is apparent from FIG. 1, in the fuse circuit configuration according to the invention, a compensation capacitor Cc is situated between the junction B, which connects the two switching transistors p1 and n1 to each other, and ground gnd.

The compensation capacitor Cc has approximately the same magnitude as the parasitic capacitor Cp that arises between the junction B between the transistor n1 and the fuse F1, on one side, and ground gnd, on the other side. When the fuse F1 is non-conductive, i.e. blown, the charging current for the automatically occurring parasitic capacitor Cp is drawn from the compensation capacitor Cc by way of the junction B and the transistor n1. A discharging of the junction B can be prevented in this way, so that this remains at high potential. The inverse state, i.e. low potential, is then present at the output OUT, which must be the case when the fuse F1 is non-conductive.

A misevaluation of the status of the fuse F1 at the output OUT of the latch L can thus be reliably prevented.

Figure 2:
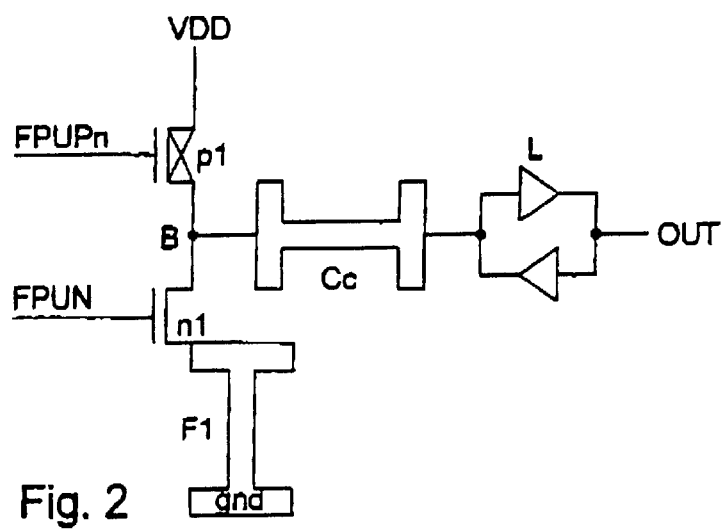
FIG. 2 is a circuit diagram of a first exemplifying embodiment of a layout of a compensation capacitor.
Figure 3:
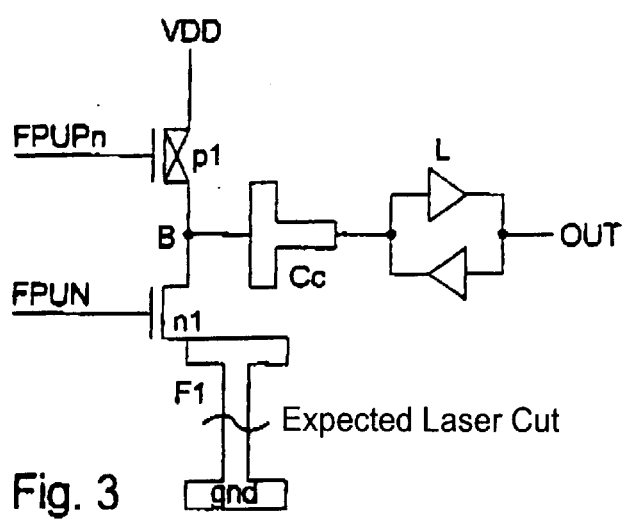
FIG. 3 is a circuit diagram of a second exemplifying embodiment of the layout of the compensation capacitor.

FIGS. 2 and 3 represent advantageous developments of the compensation capacitor Cc. As mentioned above, the compensation capacitor Cc should optimally simulate the layout of the connection between the transistor n1 and ground gnd by way of the fuse F1. To this end, the compensation capacitor Cc is constructed similarly to a printed board for the connection between the transistor n1 and ground gnd with the aid of a metal piece that forms the fuse F1, which has a tapering on which a laser can rest and cut the tapering.

In the exemplifying embodiment of FIG. 2 the complete metal piece of the fuse 1 is thus "imaged" onto the compensation capacitor Cc, so that overcompensation may occur when the fuse F1 is blown.

By contrast, in the exemplifying embodiment of FIG. 3, the compensation capacitor Cc simulates the layout of the circuit given an expected laser cut subsequent to blowing of the fuse F1. That is, the layout of the compensation capacitor Cc is reduced in that only the metal piece that remains after the laser cutting process is used for wiring.

I claim:

1. A fuse circuit configuration, comprising:

a first switching transistor;

a second switching transistor disposed in series with said first switching transistor and defining a series circuit with a junction point disposed between said first switching transistor and said second switching transistor;

a fuse connected to said second switching transistor;

an evaluation circuit connected to said junction point and having an output at which a status of said fuse can be tapped; and a compensation capacitor connected between said junction point and a ground terminal and counteracts a parasitic capacitor occurring between a connection point between said second switching transistor and said fuse on a first side and ground on a second side.

2. The fuse circuit configuration according to claim 1, wherein said compensation capacitor simulates a layout of a connection between said second switching transistor and said fuse.

3. The fuse circuit configuration according to claim 1, wherein said compensation capacitor has an equivalent capacitance as the parasitic capacitor.

4. A fuse circuit configuration, comprising:

a first switching transistor;

a second switching transistor disposed in series with said first switching transistor and defining a series circuit with a junction point disposed between said first switching transistor and said second switching transistor;

a fuse connected to said second switching transistor;

an evaluation circuit connected to said junction point and having an output at which a status of said fuse can be tapped;

a ground terminal; and a compensation capacitor connected between said junction point and said ground terminal, said compensation capacitor delivering a charging current for a parasitic capacitor occurring between a connection between said second switching transistor and said fuse on a first side and said ground terminal on a second side.

* * * * *